(12) United States Patent
Orschel et al.

(10) Patent No.: US 8,545,623 B2
(45) Date of Patent: Oct. 1, 2013

(54) METHOD AND APPARATUS FOR CONTROLLING THE GROWTH PROCESS OF A MONOCRYSTALLINE SILICON INGOT

(75) Inventors: Benno Orschel, Salem, OR (US); Keiichi Takanashi, Saga (JP)

(73) Assignees: Sumco Phoenix Corporation, Phoenix, AZ (US); Sumco Corporation, Tokyo (JP)

(*) Notice: Subject to any disclaimer, the term of this patent is extended or adjusted under 35 U.S.C. 154(b) by 1097 days.

(21) Appl. No.: 12/456,552

(22) Filed: Jun. 18, 2009

(65) Prior Publication Data

US 2010/0319611 A1    Dec. 23, 2010

(51) Int. Cl.
| | |
|---|---|
| C30B 11/00 | (2006.01) |
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |
| C30B 35/00 | (2006.01) |
| C30B 13/28 | (2006.01) |
| C30B 15/20 | (2006.01) |
| C30B 15/26 | (2006.01) |

(52) U.S. Cl.
USPC .................. 117/15; 117/11; 117/13; 117/14; 117/200; 117/201

(58) Field of Classification Search
USPC .................... 117/19, 11, 13, 14, 15, 200, 201
See application file for complete search history.

(56) References Cited

U.S. PATENT DOCUMENTS

| 5,653,799 | A | * | 8/1997 | Fuerhoff | 117/14 |
| 5,656,078 | A | * | 8/1997 | Fuerhoff | 117/201 |
| 5,665,159 | A | * | 9/1997 | Fuerhoff | 117/201 |
| 5,882,402 | A | * | 3/1999 | Fuerhoff | 117/201 |
| 6,171,391 | B1 | * | 1/2001 | Fuerhoff et al. | 117/14 |

* cited by examiner

Primary Examiner — James McDonough
(74) Attorney, Agent, or Firm — Brinks Hofer Gilson & Lione (57) ABSTRACT

The present invention provides a method and apparatus for controlling the growth of a silicon ingot in which the diameter of the growing silicon ingot can be accurately measured. A camera captures an image of the interface ring between the growing silicon ingot and the silicon melt. An image processor extracts local intensity maxima from the captured image, which are then digitized into an image data which comprises attributes of the pixels forming the local intensity maxima. An analyzer statistically analyzes the image data to derive parameters of an equation statistically simulating the interface ring. A probabilistic filter conducts the statistical analysis on the equation in which the respective pixels are weighted by their weight factors. The weight factor functions to attenuate the effect of noises caused by pixels which do not represent the interface ring. The statistical analysis may be repeated, using the renewed parameters, to progressively attenuate the effect of the noises to thereby obtain a satisfactorily accurate diameter of the silicon ingot.

15 Claims, 7 Drawing Sheets

Fig. 7

METHOD AND APPARATUS FOR CONTROLLING THE GROWTH PROCESS OF A MONOCRYSTALLINE SILICON INGOT

BACKGROUND

This invention relates generally to improvements in controlling the growth process of a monocrystalline silicon ingot and, more particularly, to a method and apparatus for accurately measuring the diameter of a monocrystalline silicon ingot during its growth process.

The Czochralski (CZ) process is used to obtain monocrystals, the most important application of which is to grow a monocrystalline silicon ingot. The silicon ingot is later sliced into silicon wafers for fabrication of semiconductor circuits thereon. Briefly described, the CZ process includes melting a charge of polycrystalline silicon in a quartz crucible and lifting a monocrystalline seed from the surface of the melt silicon. As the seed is lifted from the melted silicon, monocrystalline silicon grows from the seed and forms a cylindrical ingot.

In these days, the required standard for precisely and accurately controlling the intrinsic properties of silicon ingots during their growth has become much higher and stricter than it used to be. It is well known that the growth rate of a growing silicon ingot is one of the most important parameters which affect the intrinsic properties of the silicon ingot. In the typical CZ process, the growth rate control is achieved in a diameter control system for controlling the diameter of a growing silicon ingot. The diameter of a growing silicon ingot can be maintained constant only if the pull-speed accurately follows the growth rate of the silicon ingot.

More specifically, the typical diameter control system used in the CZ process employs a feedback controller to control the diameter of a growing silicon ingot. The controller receives a signal representing the diameter of the silicon ingot actually measured and transforms a deviation of the measured diameter from the target diameter into a pull-speed error. The pull-speed error is used to adjust the pull-speed of the seed. Further, the pull-speed error is integrated over time to derive a temperature error. Based on the derived temperature error, the temperature of the silicon melt is adjusted, resulting in adjusting the growth rate of the growing ingot. Thus, in the diameter control system used in the CZ process, an implementation of the diameter control is cascaded into an implementation of the growth rate control.

In the diameter control system used in the CZ process, therefore, the accuracy of the growth rate control depends on the accuracy of the diameter control. Any errors in inputs to the diameter control system will negatively affect not only the accuracy of the diameter control but also the accuracy of the growth rate control. Among the inputs to the diameter control system, the measured diameter is the input on which the diameter control system is designed to most sensitively react. An error in the measured diameter thus results in a serious error in the diameter control. The problem is that an error in the measured diameter propagates through the diameter control into the growth rate control and eventually negatively affects the intrinsic properties of the resulting silicon ingot. Thus, the diameter of a growing silicon ingot needs to be measured accurately to accurately and precisely control the intrinsic properties of the growing silicon ingot.

The diameter control system for the CZ process usually uses a camera to measure the diameter of a silicon ingot growing inside a furnace. The camera is set outside the furnace and observes the growth of the silicon ingot through a window of the furnace. The camera captures an image of the meniscus of the silicon ingot growing from the silicon melt. The meniscus of the growing silicon ingot is perceived as a bright ring in the crucible. The ring image captured by the camera is processed to obtain the diameter of the growing silicon ingot.

There are several known methods of measuring the diameter of a silicon ingot from its captured ring image. However, they all have problems in common. For instance, they look for pixels representing the meniscus, using only a limited number of partial scan images of the meniscus and thereby missing a large number of meniscus pixels which are not included in the limited number of partial scan images. Further, the conventional methods rely on assumptions of where to expect the meniscus pixels, which require prior knowledge of whereabouts of the meniscus pixels in the scan images or search algorithms to search the scan images for the meniscus pixels. Therefore, if the system is not set up correctly, the conventional methods relying on the assumptions can operate on serious errors during operation.

Other conventional methods rely on assumptions about brightness levels in the scan images. Like the conventional methods described above, these other conventional methods can operate on serious errors during operation if the system is not properly set up or if brightness levels change during operation, such changes being in fact likely to occur during operation. In addition, conventional image processing algorithms, due perhaps to the search algorisms used, are often not capable of operating at the full video frame rate. Consequently, one or more frames are dropped or skipped, resulting in missing valuable temporal information which could, if used, improve the signal to noise ratio. Because of these problems, the conventional methods all fall short of satisfactorily accurately measuring the diameter of a silicon ingot.

Also, there are factors presented in the CZ process which impede the accurate measurement of the diameter of a growing ingot. For instance, reflections from the silicon melt and the crown portion of the silicon ingot add noises to the captured ring image. The window when fogged obscures the ring image. Scratches on the window are another cause to add noises to the captured ring image. Also, heat shields being suspended inside the furnace usually partially block the ring image of the growing silicon ingot from the camera. There has been no apparatus or method so far to overcome the above factors and satisfactorily accurately measure the diameter of a growing silicon ingot.

SUMMARY OF THE INVENTION

The present invention specifically addresses the above problems and provides a method and apparatus for controlling the growth of a silicon ingot in which the diameter of the growing silicon ingot can be accurately measured. More specifically, the present invention uses all meniscus pixels available in an image captured by a camera, not just using pixels in partial scan images of the meniscus. Further, the present invention depends on neither an assumption as to the brightness levels in the scan images nor an assumption as to the whereabouts of the meniscus pixels. Nor does it employ any time consuming search algorisms to search for the meniscus pixels. Instead, the present invention employs a probabilistic filter which filters out improbable pixels from the captured image.

The present invention first captures an image of the interface between the growing silicon ingot and the silicon melt. An image processor processes the captured image by applying a high-pass filter to subtract backgrounds from the captured image. The background subtracted image consists of local intensity maxima and is digitized into an image data which comprises attributes of the pixels representing the local intensity maxima. The background subtracted image includes the local intensity maxima representing the elliptical edge of the interface between the growing silicon ingot and the silicon melt, which is viewable as a bright ring in the captured image. The image of the bright ring is captured elliptically due to the camera perspective distortion. After background subtraction and auto thresholding but before applying the probabilistic filter, this distortion is mathematically corrected by projecting all relevant pixels (not the entire image) onto a virtual plane parallel to the melt surface, using the position and the angle of the camera and the field of view, from which the diameter of the silicon ingot can be calculated.

The background subtracted image further includes local intensity maxima representing other parts of the silicon ingot than the interface ring, such as the crown portion of the silicon ingot, and artificial intensity maxima which result by high-pass filtering, for instance, the sharp intensity transitions between the silicon melt and the wall of the furnace in the captured image. These local intensity maxima not representing the interface ring are noises which impede an accurate calculation of the diameter of the silicon ingot.

The present invention statistically analyzes the background subtracted image in order to automatically generate a threshold intensity and extracts all pixels above that threshold for further processing. These extracted pixels are mathematically projected onto a virtual plane parallel to the melt surface to eliminate the camera perspective diction of the original pixels in the captured image. The coordinates and intensities of these corrected pixels are then statistically analyzed to derive parameters of an equation representing the interface ring appearing between the growing silicon ingot and the silicon melt. An exemplary equation for the purpose may be the circle equation in which the location of the center and the radius are the parameters. The statistical analysis may be a regression analysis, which is performed on the circle equation to derive the parameters of the equation. Due to possible noises caused by the reflections from the other parts of the silicon ingot and the intensity transitions in the captured image, however, the derived parameters may not be satisfactorily accurate.

To attenuate the effect of these noises, the present invention then implements probabilistic filtering, in which the statistical analysis is repeatedly conducted on the equation while the respective pixels are weighted by their weight factors. The individual weight factors are renewed before each round of the statistical analysis. The weight factor is a function of the attributes of the pixel to be weighted by the weight factor. The weight factor works to attenuate the effect of noises caused by pixels which do not represent the interface ring between the silicon ingot and the silicon melt. The statistical analysis may be repeated, using the renewed parameters, to progressively attenuate the effect of the noises to thereby obtain a satisfactorily accurate diameter of the silicon ingot.

The weight factor may be a function of a locational deviation of a pixel or a distance of a pixel to the calculated circle. The weight factor may also be a function of the locational deviation of the pixel and the standard deviation of the distances of the pixels to the calculated circle, so that the greater the deviation is relative to the standard deviation, the less significant the pixel becomes in the statistical analysis. The weight factor may additionally be a function of the intensity of the pixel such that the lower the intensity is, the less significant the pixel becomes in the statistical analysis.

DETAILED DESCRIPTION OF THE DRAWINGS AND THE PRESENTLY PREFERRED EMBODIMENTS

Hereinafter, a detailed explanation of the method and apparatus for controlling the diameter of a monocrystalline silicon ingot according to the present invention will be given with reference to the attached drawings.

Figure 1:
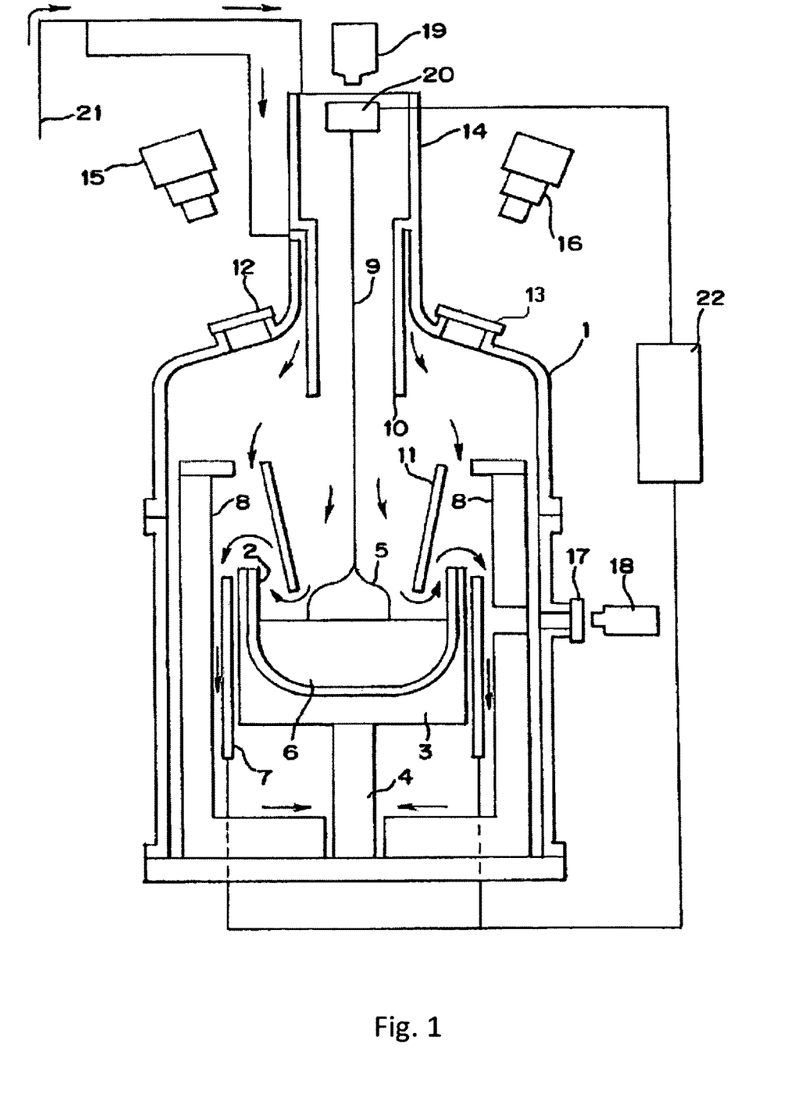
FIG. 1 is a schematic view showing a silicon crystal growing apparatus according to the present invention.

Referring now to FIG. 1, an apparatus according to the present invention is shown which implements a CZ crystal growing process. In this figure, the apparatus comprises a furnace 1. Inside the furnace 1, a quartz crucible 2 is provided which holds silicon melt 6 in it. The quartz crucible 2 is received by a graphite susceptor 3, which is fixed at the top of a drive shaft 4. The drive shaft 4 moves vertically and rotates to thereby move the quartz crucible 2 vertically as well as rotate it. A carbon heater 7 surrounds the susceptor 3 and heats the crucible 2 to control the temperature of the silicon melt 6 in the crucible 2. An insulation tube 8 is placed between the heater 7 and the furnace wall.

A tubular radiation heat shield 11 is suspended above the silicon melt 6. The heat shield 6 prevents changes of the heat history of a silicon ingot being lifted and also prevents impurities, such as CO gas from the heater 7, from entering the silicon ingot being lifted. A water cooled cooling pipe 10 is attached to the inside of a neck 14 of the furnace 1. The cooling pipe 10 controls the heat history of the silicon ingot during the lifting process. Between the cooling pipe 10 and the inner wall of the neck 14, an annular gas passage is formed through which a feed pipe 20 supplies Argon gas inside the furnace 1.

A wire 9 runs vertically through the neck 14 and the cooling pipe 10 down to the silicon melt 6 in the crucible 2. The wire 9 holds a monocrystalline silicon seed at its end. A servo motor 20 pulls up the wire 9 and lifts the crystal seed from the surface of the silicon melt 6. FIG. 1 shows a silicon ingot 5 growing out of the silicon melt 6 as the servo motor 20 pulls the wire 9 up. The wire 9 and thus the seed can be rotated by another motor not shown in the figure.

Windows 12 and 13 are formed in the shoulders of the furnace 1. An ADR sensor 15 through the window 12 captures an image of the interface between the silicon ingot 5 being pulled up and the silicon melt. A camera 16 is used to observe through the window 13 the crystal growing process occurring inside the furnace 1. A window 17 is formed in the side wall of the furnace 1, through which an ATC sensor 18 monitors the temperature of the heater 7. Further, a dichromatic thermometer 19 is placed at the top of the furnace 1 and measures the temperature of the silicon melt 6.

All the data collected by sensors 15, 16, 18 and 19 are supplied to a controller 22. The controller 22 processes the supplied data and controls the servo motor 20 and the heater 7 so as to produce a silicon ingot with a uniform diameter along the length. The controller 22 also controls a vertical movement and a rotation of the drive shaft 4. Particularly, the controller 22 controls a vertical movement of the drive shaft 4 to keep constant the vertical position of the interface between the growing silicon ingot 5 and the silicon melt 6.

Referring further to FIG. 1, it will be explained how the CZ process is implemented inside the furnace 1. A charge of polycrystalline silicon is first placed in the crucible 2. Argon gas is flown into the furnace 1 through the feed pipe 20 to fill the furnace 1 with the argon gas. The heater 7 is turned on to heat the crucible 2 and melt the polycrystalline silicon inside the crucible. The heater 7 is controlled to maintain the temperature of the silicon melt 6 according to a predetermined temperature profile.

Next, the servo motor 20 is driven to lower the wire 9 until the monocrystalline silicon seed attached to the end of the wire 9 is partially submerged in the silicon melt 6. Thereafter, the quartz crucible 2 and the crystal seed begin rotating in the opposite directions. The servo motor 20 then begins pulling up the wire 9 according to a predetermined pull-speed profile. As the crystal seed is being pulled up, the ingot 5 grows from the seed.

At regular intervals, e.g., every one second, the controller 22 calculates the diameter of the growing silicon ingot 5 based on the image captured by the ADR sensor 15 and collects the temperature information from the sensor 19. Based on the calculated diameter and the collected temperature information, the controller controls the servo motor 20 and the heater 7. By controlling the pull-speed and the temperature of the silicon melt 6, the diameter of the ingot 5 gradually increases from the crystal seed to thereby form a conical crown portion. When the ingot has grown to the intended diameter, the controller shifts its control so that the growing ingot 5 will have the constant diameter. When the ingot 5 has grown to the intended length, the controller 22 again shifts its control to gradually reduce the diameter of the ingot 5 to form a conical tail portion.

During the ingot growing process, as the ingot 5 grows, the surface of the silicon melt descents. To compensate the decent of the melt surface and keep constant the relative vertical level of the interface between the ingot 5 and the silicon melt 6, the controller has the crucible 2 raised by the drive shaft 4. When the diameter of the tail portion becomes nearly zero, the ingot 5 is lifted away from the silicon melt. The heater 7 is turned off to terminate the CZ process.

Figure 2:
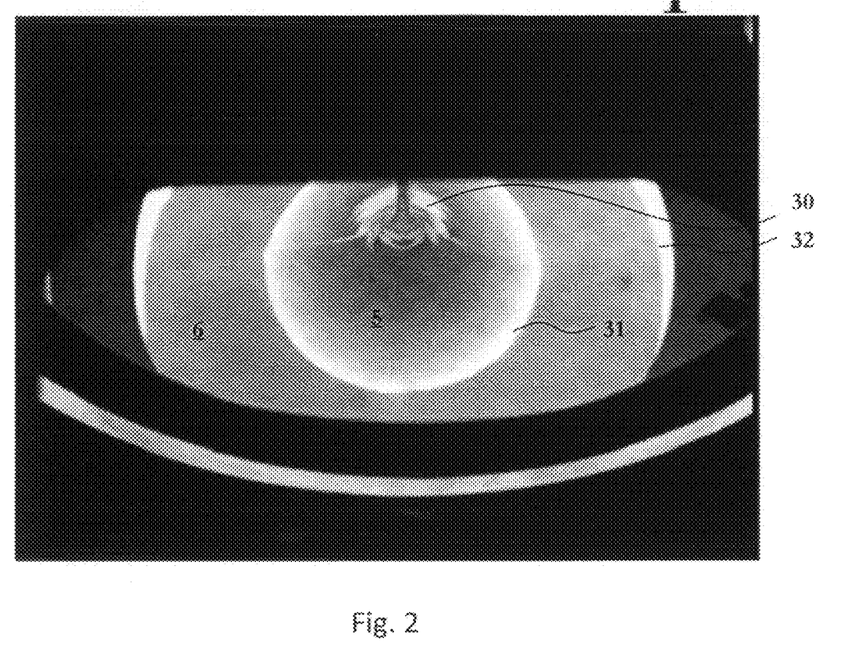
FIG. 2 is an exemplary image of a silicon ingot growing from a silicon melt.

FIG. 2 is an exemplary image of the inside of the furnace 1 captured by the ADR sensor 15 through the window 12. A bright portion 30 which appears in the shape of the letter C in the center of the image is a reflection from the crown of the silicon ingot 5. A bright ring 31 surrounding the crown 30 immediately outside the crown is a reflection from the meniscus of the silicon ingot 5 or the interface between the silicon ingot 5 and the silicon melt 6. The view of the interface ring 31 is partially blocked by the heat shield 11 being suspended inside the furnace 1. The surface of the silicon melt 6 extends outwardly from the interface ring 31 to the inner wall of the quartz crucible 2, a bound 32 of which also reflects light in the image.

The present invention provides a novel method and apparatus for accurately calculating the diameter of a growing silicon ingot, which will be discussed in detail with reference to the attached figures. Please note that throughout the description, discussions utilizing terms such as "processing" or "computing" or "calculating" or "determining" or the like, refer to the action and processes of a computer system that manipulates and transforms data represented as physical quantities. In the embodiments of the present invention, the controller 22 performs the operations for calculating the diameter of a silicon ingot. The controller 22 may be specially constructed for the required purposes, or it may comprise a general purpose computer activated or reconfigured for the required purposes by a computer program stored in the computer. Such a computer program may be stored in any type of a computer readable storage medium.

Figure 3:
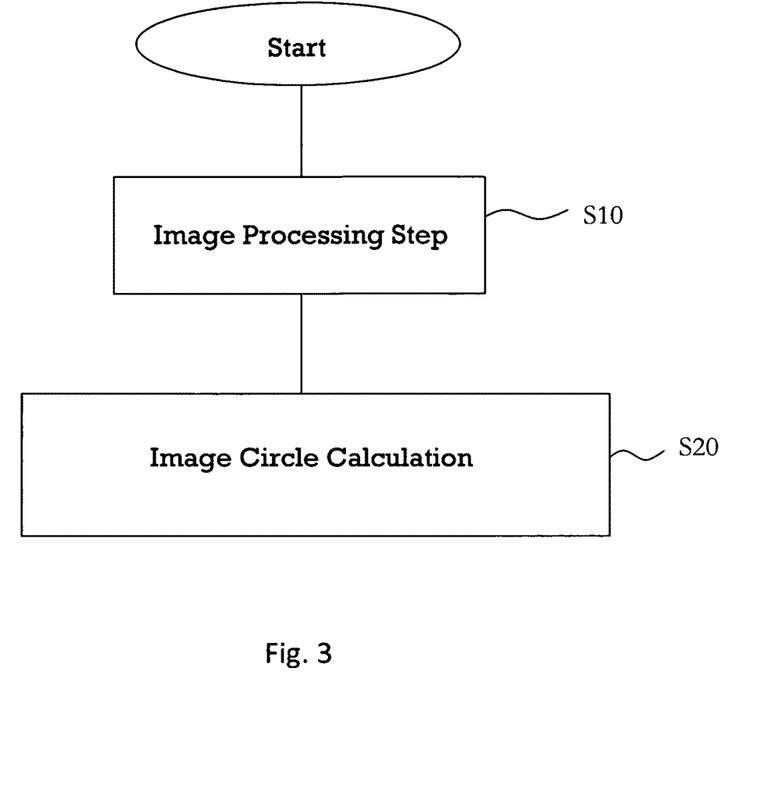
FIG. 3 is a general flowchart showing the process of calculating the diameter of the silicon ingot according to the present invention.

As shown in FIG. 3, according to the present invention, the diameter of a growing silicon ingot is calculated through two steps. The first step is an image processing step (S10) in which an image captured by the ADR sensor 15 is processed, pixels which are relevant for calculation of the diameter are extracted from the processed image. The second step involves a correction of camera perspective distortion on the extracted pixels and also involves image circle calculation (S20), using the corrected coordinates of the pixels.

Figure 4:
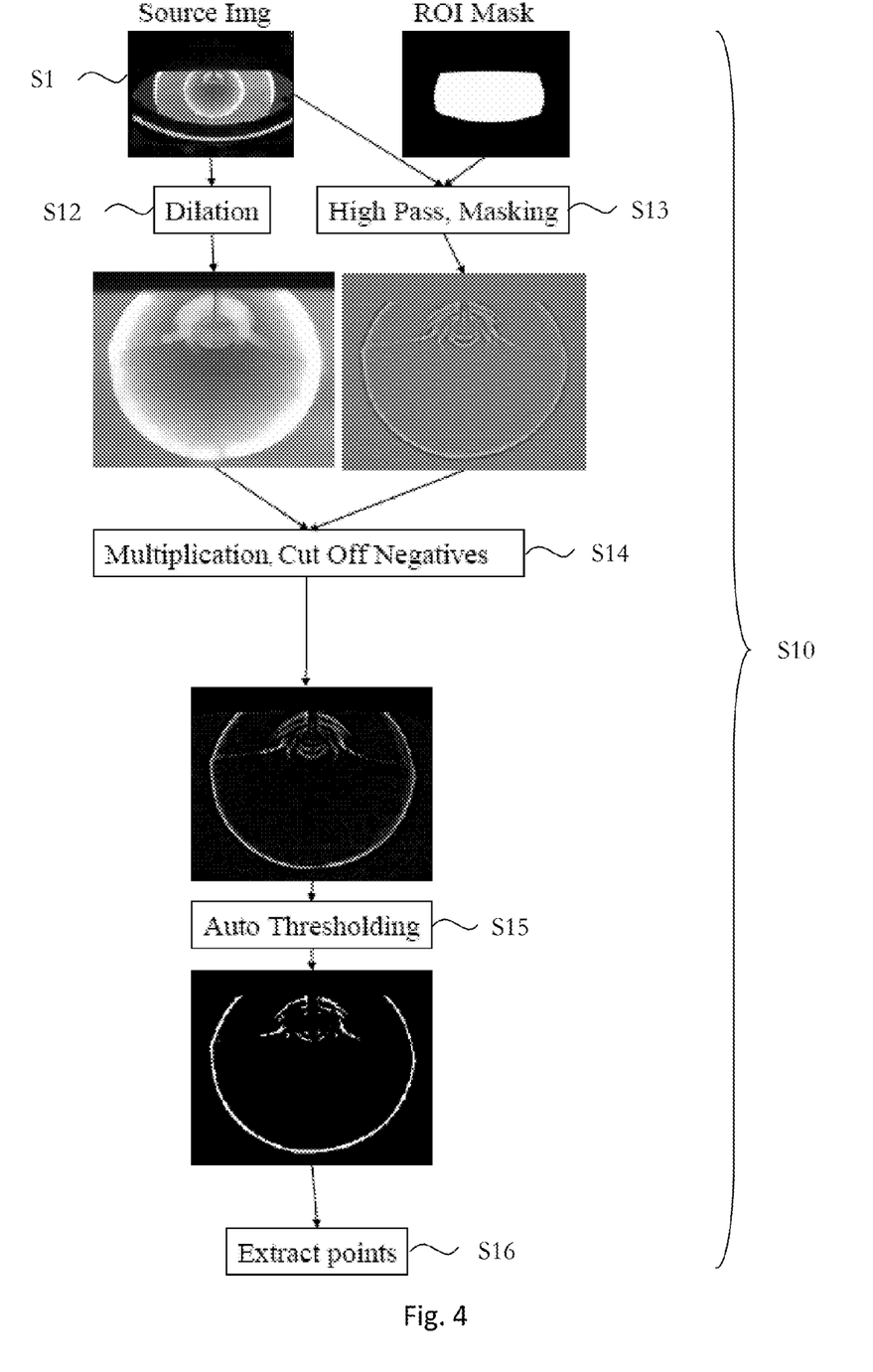
FIG. 4 is a detailed flowchart showing the first half of the process of calculating the diameter of the silicon ingot according to the present invention.

FIG. 4 shows a process flow of the steps implemented in the image processing step (S10). First, the ADR sensor 15 captures the image as shown in FIG. 3 at regular intervals (S11) in which the meniscus or the interface between the silicon ingot 5 and silicon melt is perceived as a bright ring. The image captured by the ADR sensor 15 is dilated to enlarge the image showing the interface ring (S12). By dilation, the interface ring becomes wider in the image. The image captured by the ADR sensor 15 also passes a high-pass filter and a region of interest (ROI) mask (S13). The high-pass filter attenuates low contrast regions where the intensity gradually changes in the captured image and eliminates global brightness variations. The high-pass filter thereby subtracts the background image to signify local intensity maxima including the interface ring appearing between the silicon ingot 5 and the silicon melt 6. The ROI mask extracts a portion of the image that lies within the ROI by setting to zero all values of pixels outside the ROI. The ROI mask image is produced only once, either manually or automatically, based on an image taken before the seed is dipped into the silicon melt. The ROI mask takes values each having either 1 or 0 and functions to mask out the areas where sharp transitions of intensity occur between the bright silicon melt and the dark puller parts in the captured image. If not masked out, these areas would become strong artificial maxima of intensities after being high-pass filtered. Please note that the masking may be performed after step S14, instead of being performed in step S13.

Then, in order to further enhance the local intensity maxima, the dilated image from step S12 and the "high-pass filtered and masked" image from step S13 are multiplied, and pixels having negative intensities are set to zero in the resultant image (S14). The enhanced local intensity maxima from step S14 is then subjected to auto-thresholding (S15).

Traditionally, "thresholding" means a process of eliminating any values above or below a fixed value. However, such traditional thresholding cannot reliably threshold pixels of an image which contains areas with gradually changing intensities. The present invention does not use a fixed threshold value. Instead, the present invention implements auto-thresholding in which the threshold value is dynamically determined for each of the captured images, based on the average intensity of relevant pixels in the local intensity maxima from Step 14, and excludes, from further analysis, all pixels with intensities lower than the dynamic threshold value.

The auto-threshold is determined in two steps. First, in the local intensity maxima obtained in Step 14, the intensities of pixels are averaged whose intensities exceed a fraction (typically 0.2) of the maximum intensity. In the local intensity maxima obtained in Step 14, the local maxima of the brightest intensity presumably represent the bright ring perceived at the interface between the silicon ingot 5 and silicon melt 6. Next, the auto-threshold is calculated by multiplying the average intensity calculated in the first step with another fraction (typically 0.7). The auto-threshold is reliable because it is determined by the statistically dominating pixels which are presumed to represent the bright ring at the interface between the silicon ingot 5 and silicon melt 6. Pixels with intensities above the auto-threshold are collected (S16) in a list of pixels represented by $\{u_i, v_i, I_i\}$ values, in which $\{u_i, v_i\}$ represents the location or coordinates of pixel (i) in the captured image plane and $I_i$ represents the intensity of pixel (i).

Figure 5:
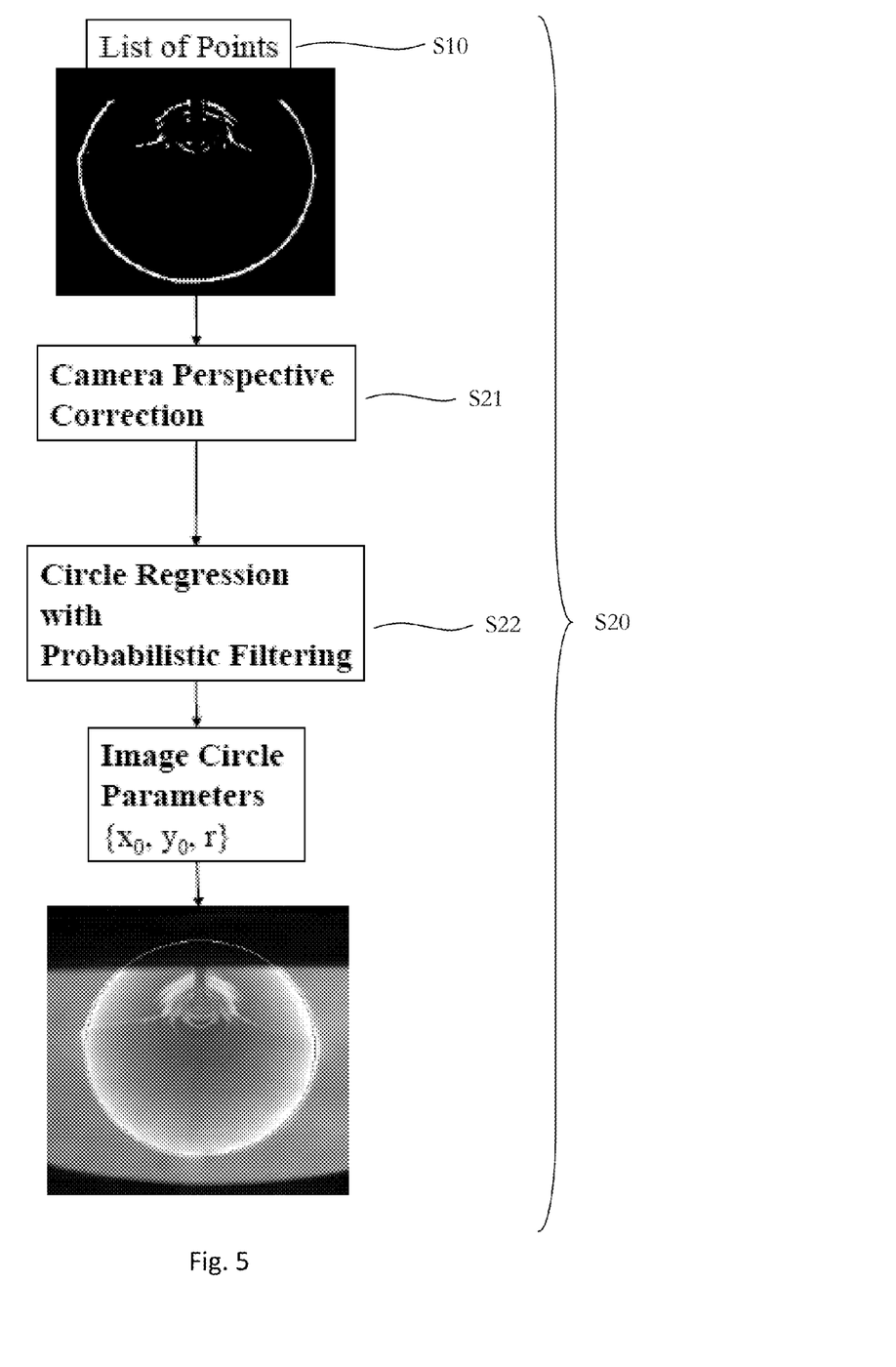
FIG. 5 is a detailed flowchart showing the second half of the process of calculating the diameter of the silicon ingot according to the present invention.
Figure 6:
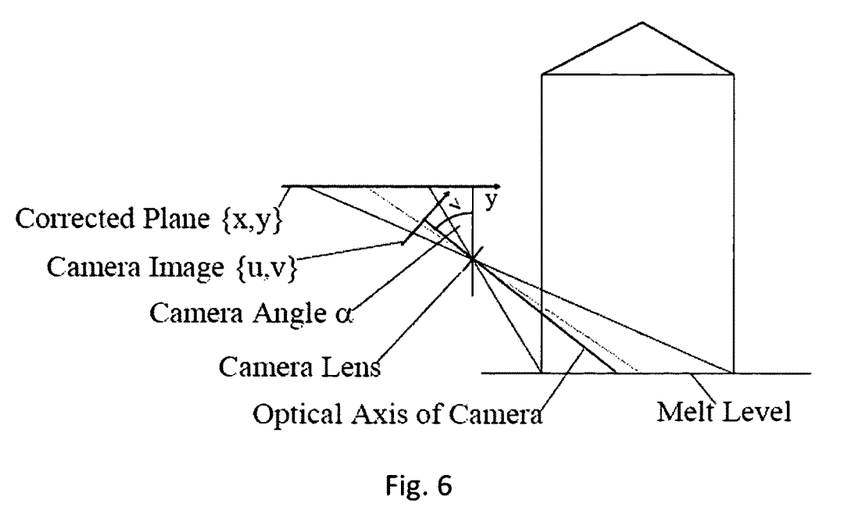
FIG. 6 is a schematic view explaining a camera perspective correction.

FIG. 5 shows a process flow of the steps implemented in the image circle calculation (S20), in which the pixels obtained in the image processing step (S10) are subjected to a probabilistic filter. The probabilistic filter filters out improbable pixels which are more than two standard deviations away from the circle representing the interface ring. First, a camera perspective correction is performed (S21) on each of the pixels from the image processing step (S10). As shown in FIG. 6, the image captured by the ADR sensor 15 is a perspective view of the ingot. The camera perspective correction mathematically projects the coordinates $\{u_i, v_i\}$ of the pixels in the captured image onto coordinates $\{x_i, y_i\}$ of points in a virtual plane that is parallel to the melt level and normalized by a unit distance to the camera lens position, using the following equations:

$$x_i = \frac{u_i}{v_i \sin(\alpha) + \cos(\alpha)} \quad (1)$$

$$y_i = \frac{v_i \cos(\alpha) - \sin(\alpha)}{v_i \sin(\alpha) + \cos(\alpha)} \quad (2)$$

where i denotes the i-th pixel (i=0, 1, 2 ... N).

The virtual plane coordinates $\{x_i, y_i\}$ of the points then go through a circle regression (S22) to derive a circle equation representing the interface ring appearing between the silicon ingot 5 and silicon melt 6. The interface ring can be approximated by a circle. Therefore, the purpose of the circle regression is to find parameters for the circle equation which statistically simulates the interface ring. A circle is expressed by the following circle equation:

$$r^2 = (x - x_0)^2 + (y - y_0)^2 \quad (3)$$

where r denotes the radius of the interface ring and $\{x_0, y_0\}$ represents the location of the center of the interface ring. The above circle equation may be transformed into the following linear equation:

$$z = a + bx + cy \quad (4)$$

where $$z = x^2 + y^2 \quad (5)$$

$$a = r^2 - x_0^2 - y_0^2 \quad (6)$$

$$b = 2x_0 \quad (7)$$

$$c = 2y_0 \quad (8)$$

Equation (4) then undergoes a circle regression analysis in which the Least Square Method is performed.

Under the Least Square Method, Equation (4) has to satisfy the following condition for the i-th pixel (i=0, 1 ... N) in terms of a, b and c.

$$0 = \frac{\partial}{\partial a, b, c} \sum_i^N w_i (a + bx_i + cy_i - z_i)^2 \quad (9)$$

where $w_i$ is a weight factor, which will be explained later in more detail. Equation (9) leads to following matrix equation (10):

$$\begin{bmatrix} \sum_i z_i x_i \\ \sum_i z_i x_i w \\ \sum_i z_i y_i w_i \end{bmatrix} = \begin{bmatrix} \sum_i w_i & \sum_i x_i w_i & \sum_i y_i w_i \\ \sum_i x_i w_i & \sum_i x_i^2 w_i & \sum_i x_i y_i w_i \\ \sum_i y_i w_i & \sum_i x_i y_i w_i & \sum_i y_i^2 w_i \end{bmatrix} \begin{bmatrix} a \\ b \\ c \end{bmatrix} \quad (10)$$

By solving Equation (10), {a, b, c} and $\{x_0, y_0, r\}$ can be determined. Please note that in the first round of circle regression analysis, the weight factor $w_i$ is set to 1 for all i.

As shown in FIG. 5, the pixels extracted in the image processing step (S10) include not only the pixels representing the bright interface ring but also other pixels representing reflections from, for instance, the crown top of the silicon ingot which have, after high-pass filtered, intensities above the auto-threshold and thus eluded the auto-thresholding. Only the pixels representing the bright interface right is valid for determining the diameter of the silicon ingot. The other pixels which have eluded the auto-thresholding are noises. The present invention uses a probabilistic filter to eliminate these unwanted pixels. In probabilistic filtering, the circle regression is repeated several times. Each time the circle regression is performed, the weight factors are adjusted according to the distances of the points to the calculated circle. Additionally, the probabilistic filtering is combined with intensity weighted filtering in which the points of maximum intensity are favored which are presumed to represent the bright ring at the interface between the silicon ingot 5 and silicon melt 6.

Please also note that for the second and subsequent rounds of circle regression analysis, the weight factor $w_i$ is not one (1) but takes the values expressed by the following equations:

$$w_i = \frac{s^2}{s^2 + e_i^2} I_i \quad (11)$$

where $$e_i = r - \sqrt{(x_i - x_0)^2 + (y_i - y_0)^2} \quad (12)$$

$$s = \sqrt{\frac{1}{N} \sum_{i=1}^N e_i^2} \quad (13)$$

In above equation (12), $\{x_0, y_0, r\}$ are the parameters of the circle equation obtained from an immediately preceding round of circle regression analysis. $I_i$ is the intensity of the i-th point. N is the number of total points. In Equation (12), $e_i$ represents an error value or a distance of the i-th point to the circle calculated from Equation (3), which represents the bright ring at the interface between the growing silicon ingot and the silicon melt. The error value is greater if a point is located further away from the calculated circle. In Equation (13), s is the standard deviation of all the error values. With the use of the weight factors $w_i$ defined in Equation (11), a point whose error value is great relative to the standard deviation will be less significant in a next round of the circular regression analysis. Also, a point whose intensity is lower will also be less significant in a next round of the circle regression analysis. Accordingly, the second and subsequent circle regression analyses each gradually remove the effect of the noises from the pixels not representing the bright interface ring. This method converges very quickly and reliably. The number that the circle regression analysis is repeated is empirically determined and is typically 10, although 5 is found sufficient. After the circle regression analysis is repeated at a predetermined time, the accurate diameter r in the virtual plane can be obtained.

As the last process, the diameter r in the virtual plane normalized by the unit distance to the camera lens is converted into the crystal diameter R, using the known distance between the camera and the melt surface h. R can be derived from elementary geometrical relations (Thales Theorem) to be R=rh.

In addition to being more robust and accurate than the conventional methods, the present invention, since processing all available relevant pixels, not processing pixels from a few scan areas, can also achieve faster processing than the conventional methods, resulting in an additional advantage of producing more temporal data that can be used to further improve the signal to noise ratio. The conventional methods typically can only process every other images in a video stream. In contrast, the present invention enables the same CPU, e.g., Pentium 4, to process every frame of standard VGA or higher resolution video.

Figure 7:
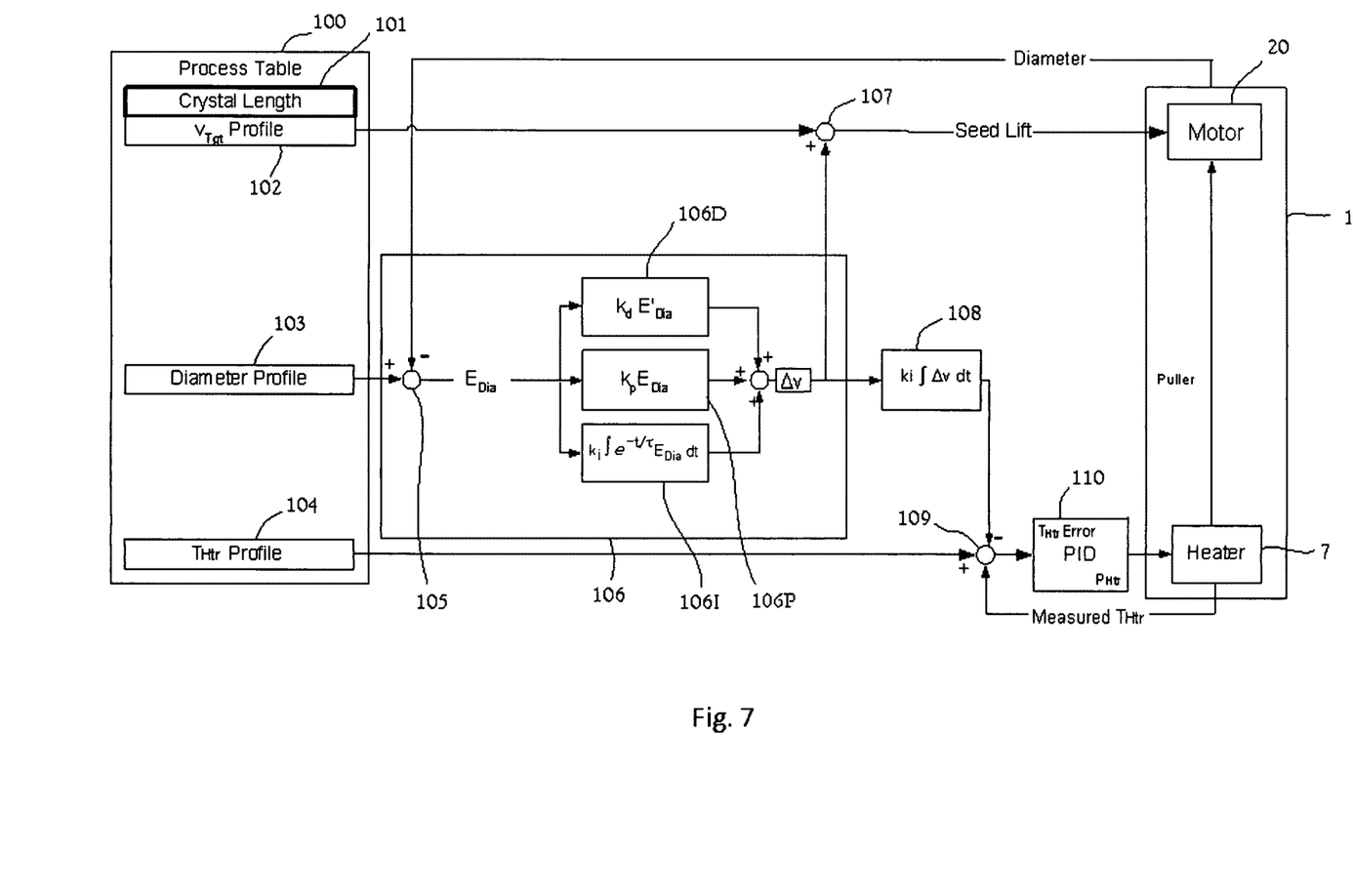
FIG. 7 is a schematic view showing an exemplary diameter control model for producing a silicon ingot with a uniform diameter.

FIG. 7 illustrates an exemplary control model for producing an ingot with a uniform diameter along the length. The control model uses the diameter of a growing silicon ingot determined above according to the present invention. It should be noted however that the control model shown in FIG. 7 is just one of the diameter control models available to produce silicon ingots with uniform diameters and that other types of diameter control models, e.g., the apparatus and method disclosed in U.S. patent application Ser. No. 12/184,016, which is incorporated herein by reference, may be used with the method and apparatus for determining the diameters discussed above.

In FIG. 7, a process table 100 is shown which is stored in the controller 22. The process table includes information on the intended ingot length 101. The process table 100 also includes a pull-speed profile table 102 which includes information on the target pull-speeds to be achieved during the CZ process. A diameter profile table 103 includes information on the target diameters to be achieved during the CZ process. A temperature profile table 104 includes information on the target temperatures to be achieved during the process. Shown on the other side of FIG. 7 is the furnace 1. The servo motor 20 for pulling up the wire 9 and the heater 7 for heating the crucible 2 are shown inside the furnace 1 in FIG. 7. Control signals are supplied to the servo motor 20 and the heater 7 to achieve the desired pull-peed and temperature of the silicon melt in order to produce a silicon crystal ingot with a uniform diameter along the length.

Using the method discussed above, the controller 22 calculates the diameter of a growing silicon ingot based on the images captured by the ADR sensor 15. The calculated diameter from the controller 22 is evaluated at an adder 105 against the target diameter from the diameter profile table 103. A diameter error $E_{DIA}$, i.e., a difference between the calculated diameter and the target diameter, is fed to a PID (proportional-integral-derivative) controller 106. The PID controller 106 comprises a proportional operator 106P, a derivative operator 106D and an integral operator 106I which perform p-term, d-term and i-term adjustments on the diameter error $E_{DIA}$ and translate the diameter error into a pull-speed error $\Delta V$. The target pull-speed from the pull-speed profile table 102 is then adjusted at an adder 107 with the pull-speed error $\Delta V$ from the PID controller 106 and supplied to control the servo motor 20, whereby the pull-speed is adjusted to the target pull-speed.

The pull-speed error $\Delta V$ from the PID controller 106 is a good representation of a temperature deviation in the silicon melt 6. The pull-speed error $\Delta V$ from the PID controller 106 is then integrated by an integral operator 108 over time and translated into a temperature adjustment. The temperature adjustment from the pull-speed error $\Delta V$ is added at an adder 109 with the target temperature from the temperature profile table 104 and the measured temperature from the sensor 19 to derive a temperature error. The temperature error goes through another PID controller 110 to control the heater 7.

As various changes could be made in the above constructions and methods without departing from the scope of the invention, it is intended that all matter contained in the above description or shown in the accompanying drawings shall be interpreted as illustrative and not in a limiting sense.

The invention claimed is:

1. A method for growing a monocrystalline silicon ingot from silicon melt according to the CZ process, comprising:
   capturing an image of the silicon ingot growing from the silicon melt;
   processing the captured image to obtain image data which comprises attributes of pixels forming at least a contour of an interface between the growing silicon ingot and the silicon melt, wherein the attributes of the pixels comprise at least one of locations of the pixels and intensities of the pixels;
   statistically analyzing the image data to derive parameters of an equation statistically simulating the contour of the interface, wherein one of the parameters relates to a diameter of the silicon ingot; and
   conducting the statistical analysis on the image data in which each pixel is weighted by a weight factor which is a function of the attributes of said each pixel, and thereby renewing the parameters,
   wherein processing the captured image comprises:
   dilating the captured image;
   applying high-pass filtering to subtract a background from the captured image to signify local intensity maxima in the captured image; and
   applying ROI masking to extract an area of interest from the captured image.

2. The method according to claim 1, wherein processing the captured image comprises multiplying the dilated captured image with the local intensity maxima to enhance the local intensity maxima.

3. The method according to claim 2, wherein processing the captured image comprises extracting points of enhanced local intensity maxima, using a dynamic threshold value which is determined by:
   averaging intensities of local maxima, among the enhanced local intensity maxima, which exceed a first fraction of brightest intensity exhibited by the enhanced local intensity maxima; and
   multiplying a second fractional number with the average intensity.

4. The method according to claim 3, wherein the first fraction is 0.2, and the second fraction is 0.7.

5. The method according to claim 3, wherein processing the captured image comprises projecting the extracted points in a camera perspective projection onto a virtual plane that is parallel to a melt surface and normalized by a unit distance to a camera lens, using camera perspective projection.

6. The method according to claim 5, wherein statistically analyzing the image data comprises performing a regression analysis on the projected points in the virtual plane to determine the circle parameters in the virtual plane.

7. The method according to claim 6, wherein the regression analysis is performed on the following equation:

$$z = a + bx + cy$$

where $$z = x^2 + y^2$$

$$a = r^2 - x_0^2 - y_0^2$$

$$b = 2x_0$$

$$c = 2y_0.$$

8. The method according to claim 1, further comprising repeating conducting the statistical analysis, using the renewed parameters.

9. The method according to claim 1, wherein the weight factor is a function of the attributes of said each pixel including the intensity of said each pixel.

10. The method according to claim 1, wherein the weight factor is a function of a locational deviation of said each pixel from a graph of solutions for the equation.

11. The method according to claim 10, wherein the locational deviation of said each pixel is expressed by the following equation:

$$e_i = r - \sqrt{(x_i - x_0)^2 + (y_i - y_0)^2}$$

where $e_i$ is the locational deviation of the i-th pixel, $\{x_i, y_i\}$ is the location of the i-th pixel and $\{x_0, y_0, r\}$ are the derived parameters.

12. The method according to claim 10, wherein the weight factor is further a function of the locational deviation of said each pixel and a standard deviation of the locational deviations of the pixels.

13. The method according to claim 12, wherein the standard deviation is expressed by the following equation:

$$s = \sqrt{\frac{1}{N} \sum_{i=1}^{N} e_i^2}$$

where $e_i$ is the locational deviation of the i-th pixel and N is the total number of the pixels.

14. The method according to claim 12, wherein the weight factor is so constructed that a pixel whose locational deviation is relatively larger than the standard deviation is less significant in the statistical analysis.

15. The method according to claim 14, wherein the weight factor is expressed by the following equation:

$$w_i = \frac{s^2}{s^2 + e_i^2}.$$

* * * * *